United States Patent [19]
Takeuchi

[11] Patent Number: 6,083,273
[45] Date of Patent: Jul. 4, 2000

[54] STATIC TIMING ANALYZER AND ANALYZING METHOD FOR SEMICONDUCTOR INTEGRATED CIRCUITS

[75] Inventor: Hideki Takeuchi, Yokohama, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/715,365

[22] Filed: Sep. 12, 1996

[30] Foreign Application Priority Data

Sep. 14, 1995  [JP]  Japan .................... 7-236644

[51] Int. Cl.⁷ .................... G06F 17/50
[52] U.S. Cl. .................... 716/6
[58] Field of Search .................... 364/489, 491, 364/578, 488, 490; 395/500.07; 716/6

[56] References Cited

U.S. PATENT DOCUMENTS

| | | | |
|---|---|---|---|
| 5,452,239 | 9/1995 | Dai et al. | 364/578 |
| 5,598,344 | 1/1997 | Dangelo et al. | 364/489 |
| 5,608,645 | 3/1997 | Spyrou | 364/491 |
| 5,740,347 | 4/1998 | Avidan | 364/489 |

*Primary Examiner*—Paul R. Lintz
*Assistant Examiner*—Thuan Do
*Attorney, Agent, or Firm*—Foley & Lardner

[57] ABSTRACT

A circuit is constructed on transistor level out of a net list and it is determined if the output node of a circuit for receiving a clock signal can go to a high impedance state from this circuit. If the output node can go to a high impedance state, it is designated as the starting point for a path searching operation and an input node of the circuit not receiving a clock signal is designated as the terminating point of the path searching operation. If, on the other hand, the output node cannot go to a high impedance state, the output node is designated as the clock node and an input node of the circuit not receiving a clock signal is designated as the terminating point of the path searching operation. With this arrangement, a sequential circuit can be divided into combinational circuits for certain.

20 Claims, 6 Drawing Sheets

STATIC TIMING ANALYZER AND ANALYZING METHOD FOR SEMICONDUCTOR INTEGRATED CIRCUITS

BACKGROUND OF THE INVENTION

1. Field of the Invention

This invention relates to a static timing analyzer that can suitably be used for computer aided design (CAD) apparatus for LSI devices in order to search for the critical path of a circuit that requires the longest time to pass therethrough by using data on transistors connections. It also relates to a method of static timing analysis that can be used for such an analyzer.

2. Description of the Related Art

Recently, the number of transistors that can be contained in a single LSI unit has been remarkably increasing and more and more complex circuits are currently being used for microprocessors and other system devices. Thus, the use of CAD apparatus is indispensable for the manufacture of semiconductor devices if large scale and complex semiconductor devices of high performance are to be designed without requiring a long design phase. Static timing analysis systems have been proposed as a useful tool to be used for CAD apparatus in order to search for the critical path of a circuit on the basis of data on transistor connections. The static timing analysis system has been increasingly getting popularity in recent years because it does not require the use of a combinational sequence of input signals referred to as a test vector and hence involves only a short run time. Known static timing analysis systems include those that carry out analytic operations at gate level of inverter circuits and NAND-circuits and those that execute analytic operations at transistor level. As for the algorithm for searching for paths, different algorithms have been known that include the one named as Path Mill and marketed by EPIC.

Additionally, a technique named as Gated Clock has recently been developed for designing power saving microprocessors. It is a technique of gating clock signals by means of NAND-circuits and other circuits that requires a static timing analysis to be conducted on the designed circuit.

Meanwhile, a number of algorithms have been proposed for static timing analysis systems that read and analyze net lists at transistor level.

Figure 10:
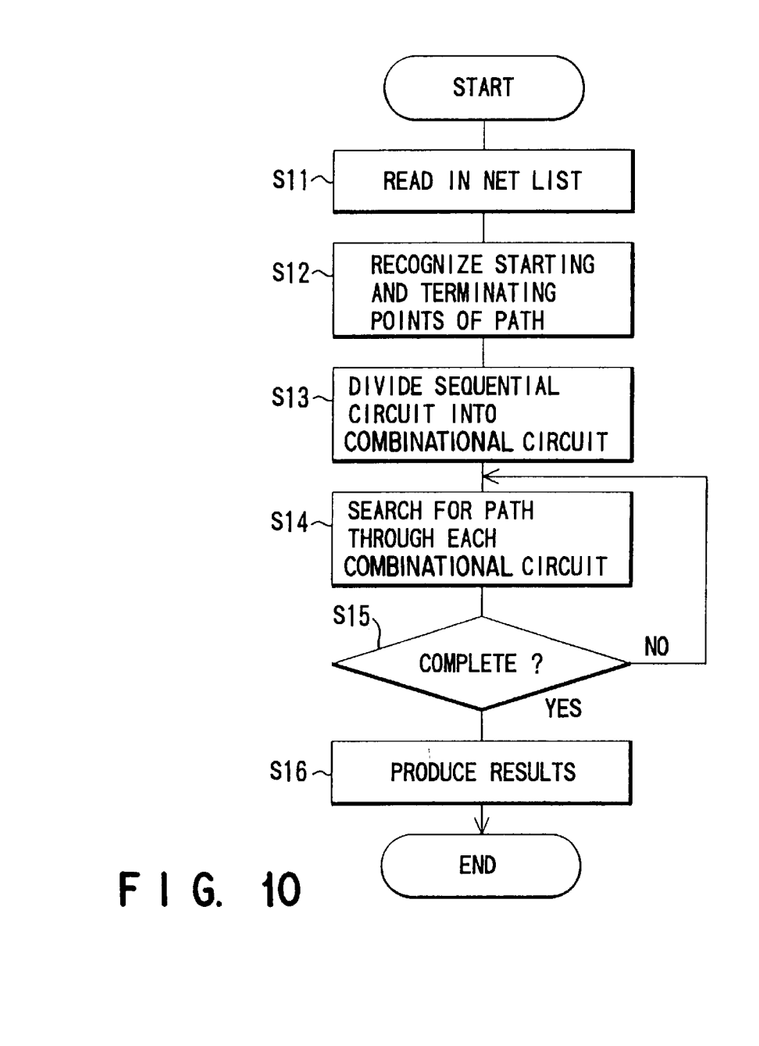
FIG. 10 is a flow chart of a known static timing analyzing method.

FIG. 10 of the accompanying drawings illustrates, as an example, a known method of static timing analysis. The processing flow of FIG. 10 proceeds in a manner as described below. Firstly, a net list is read out of a memory and then stretched out to construct a data structure from it (Step S11). Thereafter, the starting point and the terminating point of each path searching operation that have been designated by the user by means of an editor are recognized from the generated data structure (Step S12). A synchronous sequential circuit (hereinafter referred to simply as sequential circuit) is identified and divided into combinational circuits on the basis of the starting point and the terminating point of each path searching operation (Step S13). All the combinational circuits obtained by the division are subjected to path searching operations for static timing analysis (Steps S14, S15) and the obtained results are produced as output (Step S16).

The method of FIG. 10, however, is cumbersome in that the user has to designate starting and terminating points for all path searching operations. This by turn reduces the efficiency of design work and prolongs the time required for it.

Figure 11:
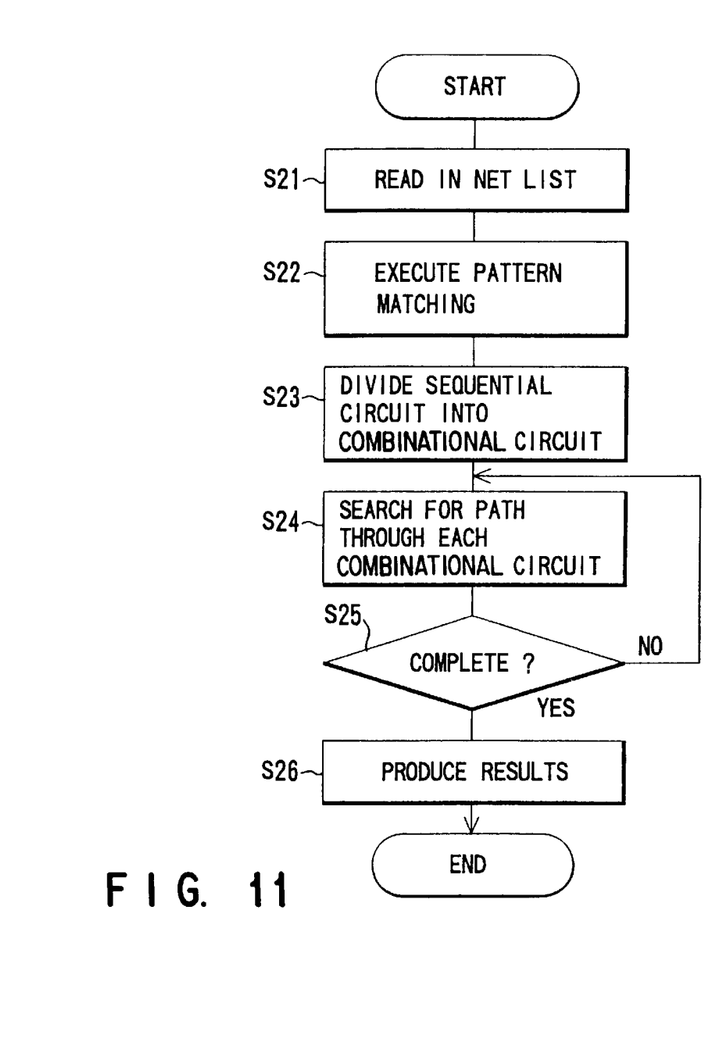
FIG. 11 is a flow chart of another known static timing analyzing method.

FIG. 11 illustrates another known method of static timing analysis. With this method, firstly, a net list is read out of a memory and then a data structure is constructed from it (Step S21). Thereafter, a pattern matching operation is carried out by using a set of predetermined rules and user-defined rules to convert the nets that are expressed at transistor level into those expressed at gate level (Step S22). Then, a sequential circuit is identified and divided into combinational circuits (Step S13). All the combinational circuits obtained by the division are subjected to path searching operations at gate level for static timing analysis (Steps S24, S25) and the obtained results are produced as output (Step S26).

The known method of FIG. 11 is very time-consuming because of the pattern matching operation. Additionally, it is cumbersome to the user because the he or she is required to define rules for pattern matching. Generally speaking, a higher timing accuracy can be achieved at transistor level than at gate level in the path searching operation and, therefore, the searched paths can be accurately verified for activation to reduce the number of false paths. However, since the path searching operation is conducted at gate level with the method of FIG. 11, it is accompanied by a poor timing accuracy and hence cannot reduce the number of false paths to consequently reduce the efficiency of design work and prolong the time required for it.

Figure 12:
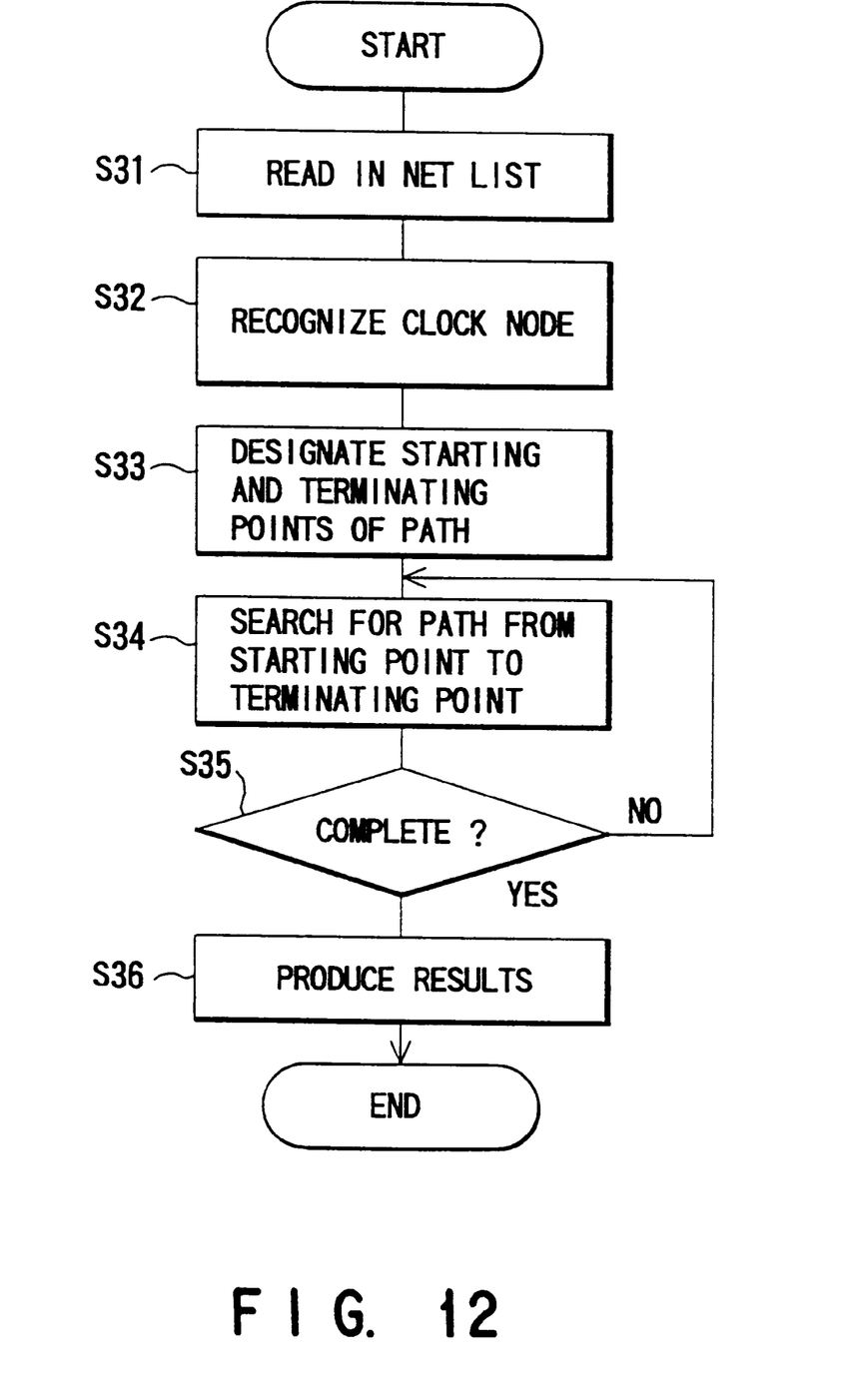
FIG. 12 is a flow chart of still another known static timing analyzing method.

FIG. 12 illustrates still another known method of static timing analysis. With this method, firstly, a net list is read out of a memory and then a data structure is constructed from it (Step S31). Thereafter, the signal input and output terminals and the clock node for receiving clock signals that have been defined by the user are recognized (Step S32). The starting point and the terminating point of each path searching operation are designated on the basis of the recognized clock node (Step S33). The above described Path Mill marketed by EPIC may be used for designating the starting and terminating points of each path searching operation. It is a system that sequentially verify all the nodes starting from the clock node specified by the user. If the search operation finally gets to the gate of a transistor other than the inverter circuit, the node is defined as the terminating point of the path searching operation while the source or drain of the transistor is designated as the starting point of the path searching operation. After defining the starting and starting points for all the path searching operations, the operations are actually carried out from the respective starting points down to the respective terminating points (Step S34, S35). When all the path searching operations are over, the obtained results are produced as output (Step S36).

The known method of FIG. 12 is better than that of FIG. 11 in terms of timing accuracy because the path searching operations are carried out at transistor level with it. However, when the starting and terminating points are designated for path searching operations, paths are searched for only if the clock signal is at a high level and not if at a low level and, therefore, it is difficult to discriminate between precharge circuits and latch circuits with this method. Additionally, since the output of a NAND-circuit is not recognized as clock with this method, it cannot adapt itself to the clock gate that is currently being popularly used as a tool for designing LSI devices. Still additionally, the sequential circuit is not divided into combinational circuits with this method. Therefore, it is not verified if each searched path can be activated or not and there can be given rise to a large number false paths to consequently reduce the efficiency of design work and prolong the time required for it.

As discussed above, any known path analysis systems cannot identify the sequential circuit and can give rise to a large number of false paths because paths are not satisfactorily searched for at the time of designating starting and terminating points for path searching operations. Furthermore, such known path analysis systems are burdensome to the user and cannot analyze circuits designed by using the gated clock technique so that they entail a low efficiency and a long work time for design works.

SUMMARY OF THE INVENTION

Therefore, it is the object of the present invention to provide a static timing analyzer and an analyzing method for semiconductor integrated circuits that can identify a sequential circuit and divide it into combinational circuits and also can produce results of analysis not containing a significantly large number of false paths so that it can be used for computer aided design apparatus with an improved design efficiency, a decreased design time and hence a reduced burden on the part of the user.

According to the invention, the above object is achieved by providing a static timing analyzer for semiconductor integrated circuits comprising:

a memory device for storing a net list as data on circuit connections;

a specifying device for specifying a clock node for receiving an input clock signal; and a control unit connected to the memory device;

the memory device including:

a constructing means for constructing a circuit at transistor level on the basis of the net list read out of the memory device, the constructed circuit including a sequential circuit;

a recognizing means for recognizing the clock node specified by the specifying device from the circuit constructed by the constructing means;

a dividing means for dividing the sequential circuit of the constructed circuit into a plurality of combinational circuits by tracing the recognized clock node on the basis of a clock signal and determining if the output node of the circuit goes to a high impedance state in response to the clock signal; and a searching means for searching for paths in the combinational circuits obtained by division.

According to another aspect of the invention, there is provided a static timing analyzing method for semiconductor integrated circuits comprising steps of:

constructing a circuit at transistor level from a net list containing data on circuit connections, the constructed circuit including a sequential circuit;

recognizing the node to which the clock signal applied by an input means is supplied from the constructed circuit;

dividing the sequential circuit of the constructed circuit into a plurality of combinational circuits on the basis of the recognized node by tracing the recognized clock node on the basis of the clock node and determining if the output node of the circuit can go to a high impedance state in response to the clock signal; and searching for paths through the combinational circuits obtained by division.

Thus, according to the invention, if the output node of the circuit to which a clock signal is applied can go to a high impedance state is determined by another circuit constructed at transistor level from a net list. If the output node can go to a high impedance state, it is designated as the starting point of a path searching operation and an input node of the circuit to which no clock signal is applied is designated as the terminating point of the path searching operation. If, on the other hand, the output node cannot go to a high impedance state, it is designated to be the node for transmitting the clock signal and an input node to which no clock signal is applied is designated as the terminating point of a path searching operation. With this arrangement, a sequential circuit can be recognized for certain and hence can be divided into combinational circuits.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Now, the present invention will be described by referring to the accompanying drawings that illustrate preferred embodiments of the invention.

Figure 2:
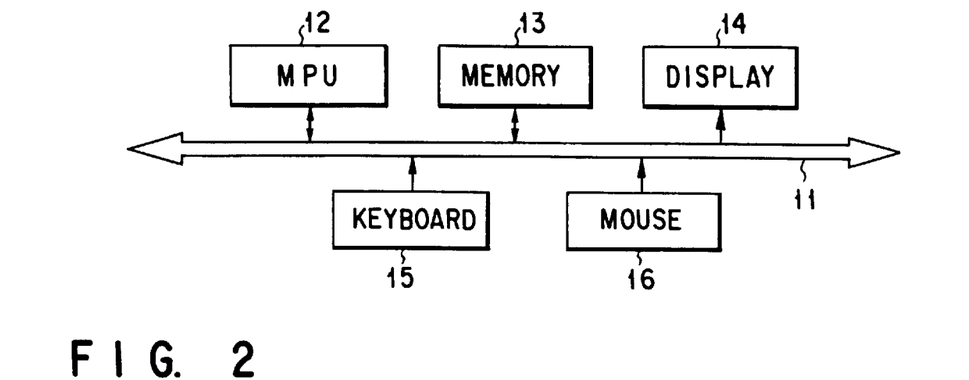
FIG. 2 is a block diagram of a preferred embodiment of the invention.

FIG. 2 is a block diagram of a preferred embodiment of static timing analyzer according to the invention. It typically comprises a microprocessor unit (MPU) 12, a memory 13, a display unit 14, a keyboard 15 and a mouse 16. The memory 13 stores net lists at transistor level containing data on the connections of the circuit to be processed as will be described hereinafter as well as other data including programs for controlling the operation of the MPU 12 to recognize clock nodes as will be described hereinafter, divide a sequential circuit, search for paths and produce as output the results of such operations. The display unit 14 displays the processing operations of the MPU 12, the results of the operations, data on the specification of a clock node entered by way of the keyboard 15 and the data specified by way of the mouse 16.

The analyzing method used by the above described static timing analyzer will now be described by referring to FIG. 2.

Figure 1:
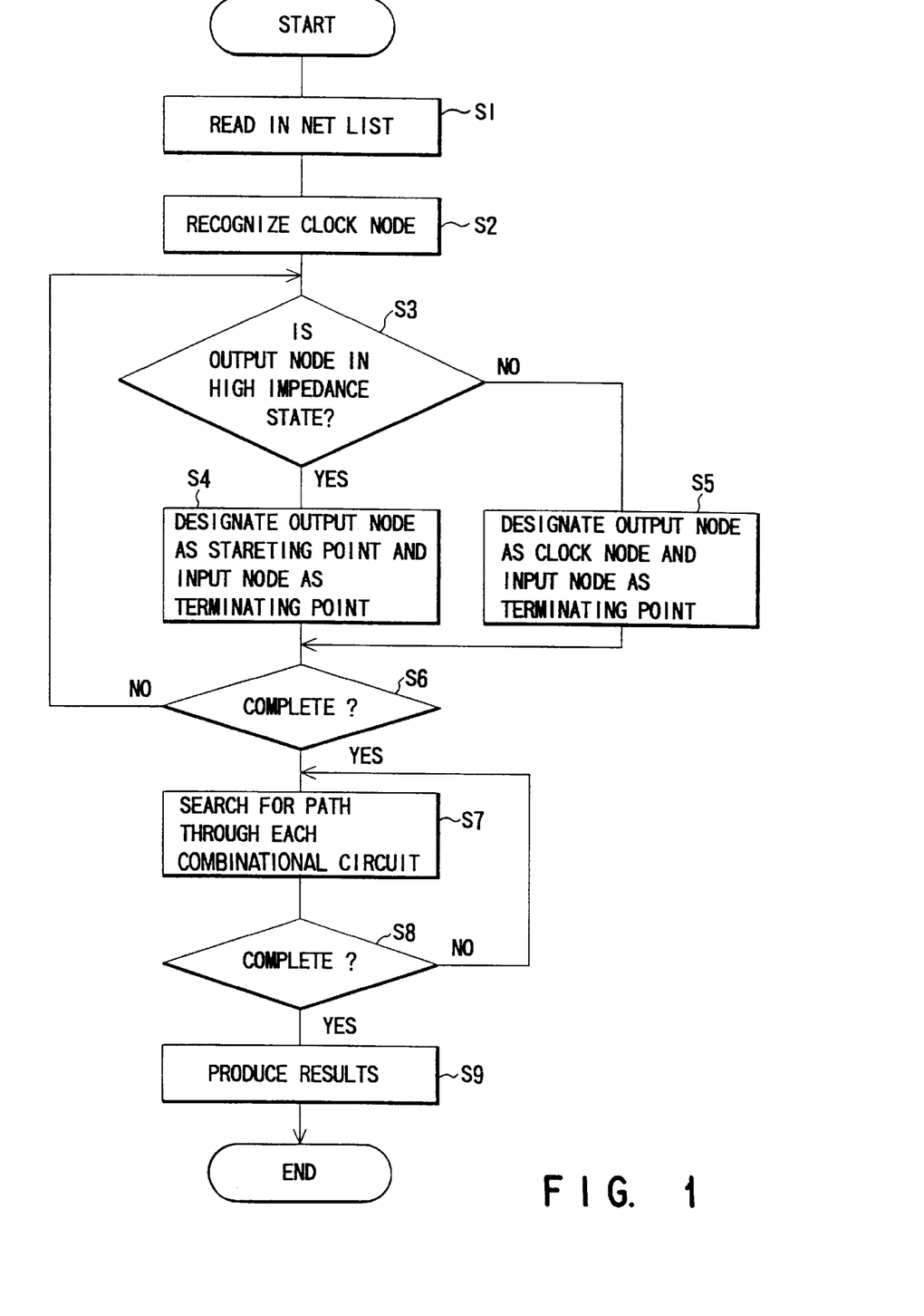
FIG. 1 is a flow chart illustrating the operation of an embodiment shown in FIG. 2.

The static timing analyzer firstly reads a net list on a circuit to be processed from the memory 13 and constructs a data structure necessary for the processing operation (Step S1). Then, the analyzer stretches out the data read out of the memory 13 and having a hierarchical structure to a flat state. Then, it recognizes the node specified by the user to receive clock signals, or the clock node, from the stretched out flat data (Step S2). An editor is typically used for specifying a clock node so that the desired clock node may be entered in the editor on the screen of the display unit by way of the keyboard 15. After recognizing the clock node, it divides a sequential circuit into groups comprising only combinational circuits. This dividing operation is carried out in a manner as described below.

Generally, a sequential circuit is caused to store data by an high impedance state produced by a clock signal. In other words, a signal path comes to be interrupted by a node in a high impedance state. Taking this in mind, the analyzer firstly traces the clock node according to the clock signal in the operation of dividing a sequential circuit to detect an output node that can be brought into a high impedance state by a clock signal (Step S3). If the output node of the circuit to which the clock signal is applied can be brought into a high impedance state, the output node of the circuit is designated as the starting point for a path searching operation and an input node to which no clock signal is applied is designated as the terminating point of the path searching operation (Step S4). Such a circuit may be a pass transistor for receiving complementary clock signals at the gate, a precharge circuit or a clock type CMOS circuit.

If the output node of the circuit to which the clock-signal is applied cannot be brought into a high impedance state, the output node of the circuit is designated as the clock node and an input node to which no clock signal is applied is designated as the terminating point for a path searching operation (Step S5). Such a circuit may be an inverter circuit, a NAND-circuit or a NOR-circuit that constitutes a gated clock.

The above described operation is repeated to divide the sequential circuit into groups comprising only combinational circuits (Step S6). After the completion of the dividing process, a conventional operation of searching for the critical path that takes the longest time to pass through is carried out on each circuit (Step S7, S8). When a path searching operation is carried out on all the combinational circuits, the results are shown on the display unit 14 (Step S9).

For carrying out an actual static timing analysis system, a pattern matching technique can be used to recognize inverter circuits and transistors in advance to reduce the time required for the operation.

Figure 3:
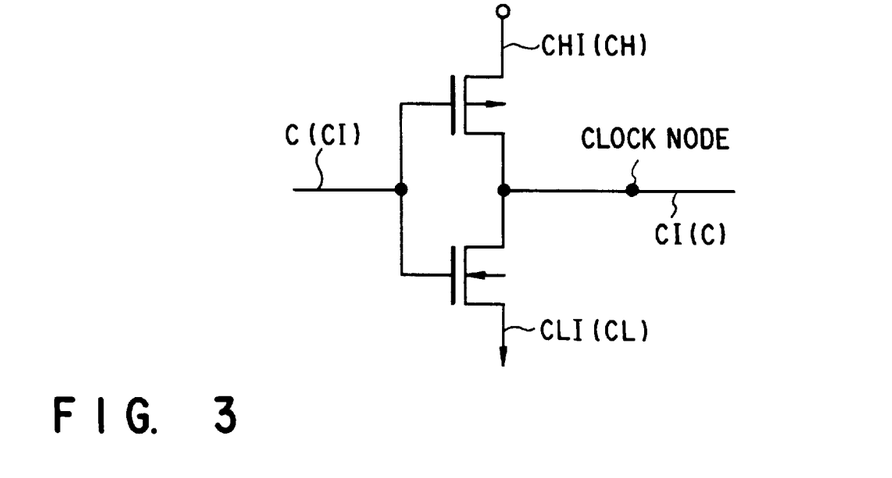
FIG. 3 is a circuit diagram illustrating how to divide a sequential circuit according to the invention.

Now, the process of dividing a sequential circuit in Steps S3 through S6 of FIG. 3 will be discussed in greater detail. Firstly, the level of a clock signal and that of each node corresponding to the clock signal are defined as shown in FIG. 3.

Clock signal C is set in the clock node designated by the user and the transmission path of the clock signal is traced on the basis of this node. If a clock signal C is supplied to the input node of the inverter circuit in FIG. 3, an inverted clock signal CI is made to appear at the output node of the circuit. When a clock signal C enters the gate of a P-channel MOS transistor (hereinafter referred to as PMOS), the high level portion CHI of a clock signal CI with a phase inverted relative to that of the clock signal C will appear at the source or drain of the transistor. Similarly, when a clock signal C enters the gate of an N-channel MOS transistor (hereinafter referred to as NMOS), the low level portion CLI of a clock signal CI with a phase inverted relative to that of the clock signal C will appear at the source or drain of the transistor.

If, on the other hand, a clock signal CI is supplied to the input node of the inverter circuit, an inverted clock signal C is made to appear at the output node of the circuit. When a clock signal CI enters the gate of the PMOS, the high level portion CH of a clock signal C with a phase inverted relative to that of the clock signal CI will appear at the source or drain of the transistor. Similarly, when a clock signal CI enters the gate of the NMOS, the high level portion CL of a clock signal C with a phase inverted relative to that of the clock signal CI will appear at the source or drain of the transistor. When a clock signal C, CI, CH, CL, CHI or CLI enters the drain or source of the PMOS or NMOS, the signal is transmitted to some other channel without alteration.

With the above in mind, a method of designating starting and terminating points for a path searching operation will be described below.

Figure 4:
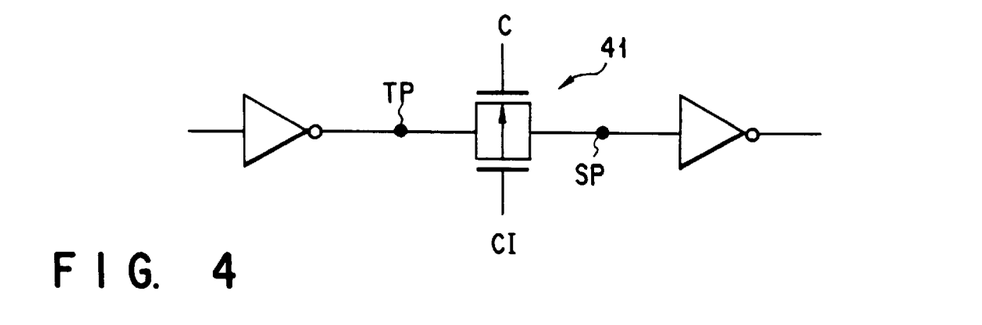
FIG. 4 is a circuit diagram illustrating how to designate starting and terminating points for a path searching operation in a pass transistor.

FIG. 4 is a circuit diagram of a pass transistor. A pass transistor 41 is used as a component of a flipflop or latch operating as a memory device. The sources and the drains of a PMOS and an NMOS are commonly connected and the circuit is recognized as a pass transistor when complementary signals are applied to the respective gates. As shown in FIG. 4, starting and terminating points are defined for a path searching operation depending on the direction of signal transmission of the pass transistor 41.

Figure 5:
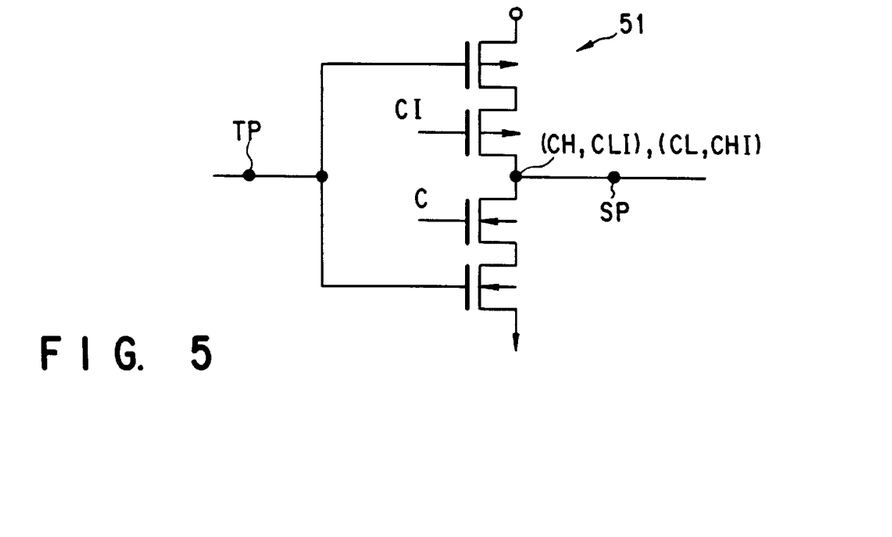
FIG. 5 is a circuit diagram illustrating how to designate starting and terminating points for a path searching operation in a clock type CMOS circuit.

FIG. 5 shows a circuit diagram of a clocked inverter circuit as an example of clock type CMOS circuit. When the clock signal applied thereto is at a high level, the output of the clocked inverter circuit 51 is determined as a function of the value of the input signal. When, on the other hand, the clock signal applied thereto is at a low level, the output is in a high impedance state regardless of the level of the input signal. Starting and terminating points are defined for an operation of searching for paths through a clock type CMOS circuit by utilizing this characteristic of the circuit. Firstly, if the two requirements listed below are met, a circuit is recognized as a clock type CMOS circuit.

(a) Signals CH and CLI or signals CL and CHI appear on a same node.

(b) There are transistors whose paths from the power source to the ground are interrupted by a clock signal and transistors whose gates are commonly connected.

When the requirement (a) met, it is confirmed that a high impedance state is generated at the node. The requirement (b) is necessary to discriminate between a precharge circuit and an NAND-circuit.

The following operations are conducted on the circuit that is recognized as a clock type CMOS circuit on the basis of the above requirements.

(1) The node that meets the requirement (a) is designated as the starting point SP for the path searching operation.

(2) The node that meets the requirement (b) is designated as the terminating point TP for the path searching operation.

Figure 6:
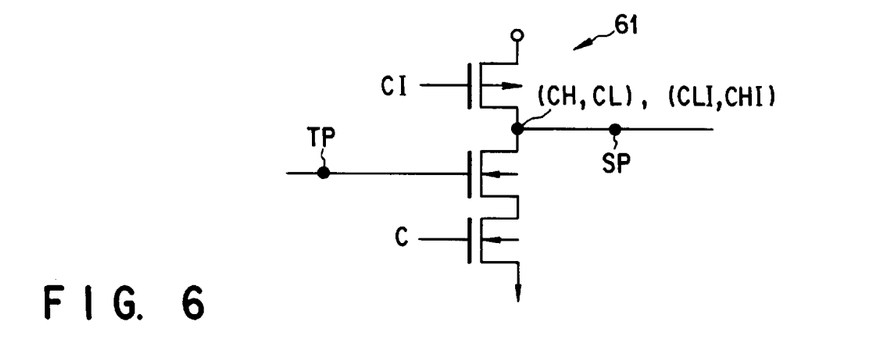
FIG. 6 is a circuit diagram illustrating how to designate starting and terminating points for a path searching operation in a precharge circuit.

FIG. 6 is a circuit diagram of a precharge circuit. The output signal of the precharge circuit 61 is held to a high level regardless of the value of the input signal when the clock signal applied to it is at a low level (precharge period) and goes down to a low level depending on the value of the input signal when the clock signal is at a high level (estimation period). A precharge circuit is recognized by utilizing this characteristic. In other words, a circuit is recognized as a precharge circuit when the requirement (a) below is met.

(a) Signals CH and CL or signals CLI and CHI appear on a same node and the node can be brought to a high or low level only by the transistor to which a clock signal is applied.

This requirement is based on the characteristic of the circuit that the output node can be brought to a high impedance state by a clock signal.

The following operations are conducted on the circuit that is recognized as a precharge circuit on the basis of the above requirement.

(1) The nodes where signals CH and CL or signals CLI and CHI appear is designated as the starting point for the path searching operation.

(2) The gate of the transistor to which a signal other than a clock signal is applied is designated as the terminating point for the path searching operation.

Note that, however, when a so-called domino circuit realized by cascading precharge circuits is to be analyzed, the attribute of the circuit that is recognized as a precharge circuit is added to the starting and terminating points of a path searching operation on the circuit. In the case of a circuit such as a domino circuit that comprises a plurality of successively connected precharge circuits through which a signal passes within an estimation period, a path searching operation is not terminated at the terminating point of a precharge circuit but continued to the next precharge circuit, taking the phase of the clock signal into consideration. A path searching can be conducted on a domino circuit only in this way.

Figure 7:
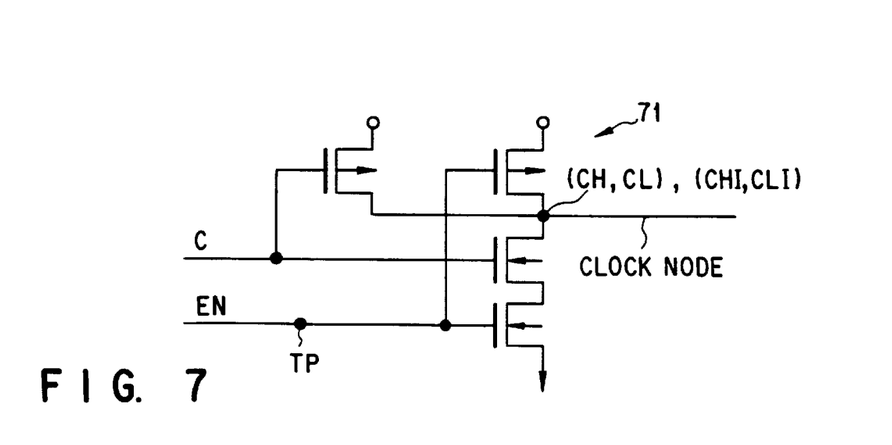
FIG. 7 is a circuit diagram illustrating how to designate starting and terminating points for a path searching operation in a gate circuit.

FIG. 7 is a circuit diagram of an NAND-circuit that is a typical gate circuit. A clock signal C and an enable signal EN are applied to a NAND-circuit 71 that is used for a gated clock. The NAND-circuit 71 passes a clock signal therethrough when the enable signal EN is at a high level but does not pass a clock signal when the enable signal EN is at a low level, whereas the output of the NAND-circuit is always at a high level. Thus, a gated clock may or may not pass a clock signal depending on the level of the enable signal applied thereto. The output signal of the gated circuit is never in a high impedance state. A gate circuit can be recognized by utilizing these characteristics. More specifically, a circuit is recognized as a gate circuit when the requirements (a) and (b) listed below are met.

(a) When signals CH and CL or signals CLI and CHI appear on a same node, there is a device that can bring said node to a high level or a low level other than the device to whose gate a gate clock is applied.

(b) The gate of the transistor connected to said node and to which a clock signal is not applied and the gate of another transistor are commonly connected.

When the requirement (a) is met, it is confirmed that the output is not brought to a high impedance state. The requirement (b) is necessary to confirm that the clock signal is controlled by the enable signal.

The following operations are conducted on the gate that is recognized as a gate circuit on the basis of the above requirements.

(1) The node that meets the requirement (a) is designated as the clock node.

(2) the node that meets the requirement (b) is designated as the terminating point of the path searching operation.

Note that the timing of the enable signal fed to the gated clock is determined according to the clock signal and hence the combinational circuit that produces the enable signal has to be analyzed for paths too.

Figure 8:
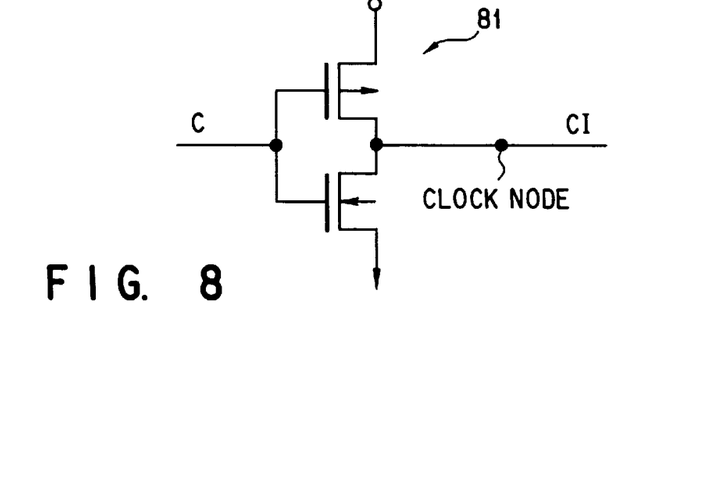
FIG. 8 is a circuit diagram illustrating how to designate starting and terminating points for a path searching operation in an inverter circuit.

FIG. 8 is a circuit diagram of an inverter circuit. When the inverter circuit 81 is recognized by pattern matching and a clock signal is applied to its input node, its output node is designated as the clock node because an inversion signal of the applied clock signal is produced from the output node.

In the above described manner, all the circuits for each of which an input signal, an output signal and starting and terminating points for a path searching operation are designated are grouped into combinational circuits in such a way that each group contains all the nodes related to an input signal and the starting point of a path searching operation so that consequently a sequential circuit is divided into a plurality of combinational circuits.

Figure 9:
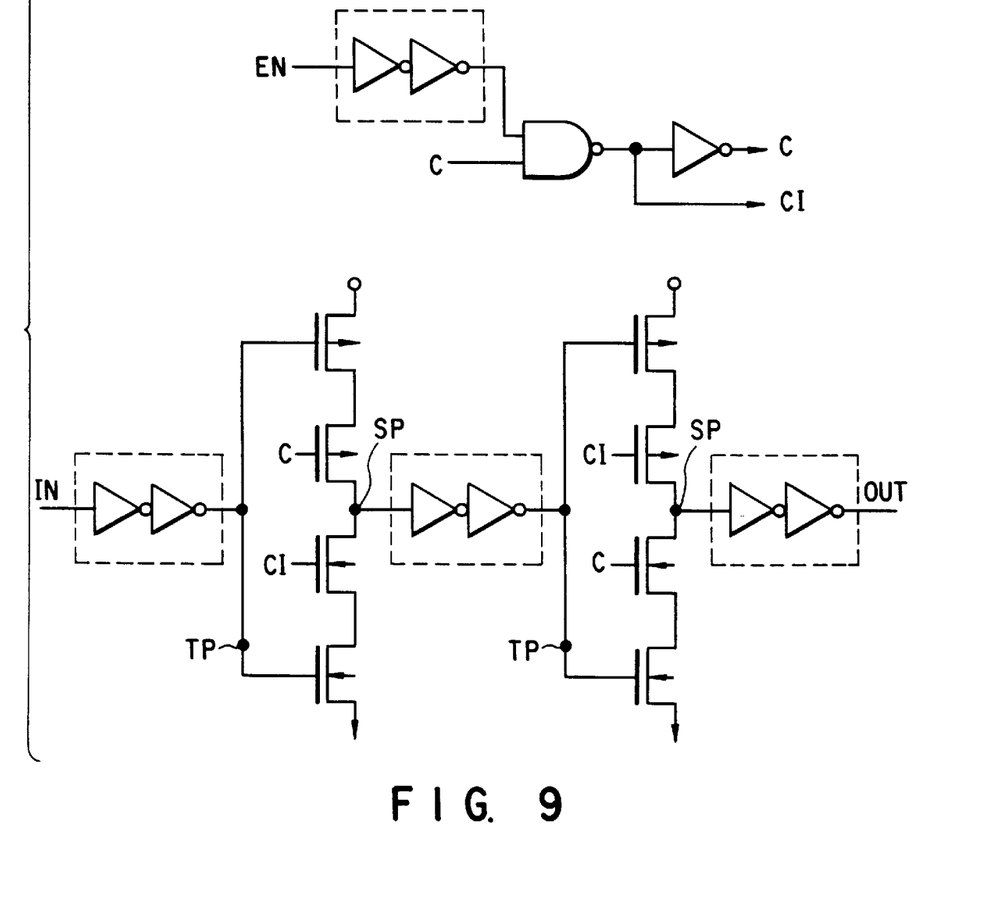
FIG. 9 is a circuit diagram of a divided test circuit.

FIG. 9 is a circuit diagram of a test circuit divided by the above described method. In FIG. 9, the test circuit is divided into four combinational circuits, each of which is subjected to a path searching operation and the obtained results are displayed.

With the above embodiment, it is determined if the output of a circuit to which a clock signal is applied can be brought to a high impedance state by means of a circuit structure obtained by stretching out a net list. If it is determined that the output of the circuit can be brought to a high impedance state, the output of the circuit is designated as the starting point of a path searching operation and an input of the circuit to which a clock signal is not applied is designated as the terminating point of the path searching operation. If the output of the circuit cannot be brought to a high impedance state, it is designated as the clock node and an input of the circuit to which a clock signal is not applied is designated as the terminating point of the path searching operation. In this way, a sequential circuit can be divided into combinational circuits for certain.

The dividing operation is advantageous in that it can discriminate between a precharge circuit and a latch circuit and the output of a NAND-circuit can be recognized as a clock node because a path searching operation is carried out when the clock signal is at a low level. Thus, a sequential circuit can be divided into combinational circuits for certain so that the operation can be adapted to a clocked gate and hence a domino circuit realized by cascading precharge circuits and a circuit comprising a gated clock can also be analyzed without problem. Furthermore, an excellent timing accuracy can be achieved to reduce false paths in the result of analysis because the dividing operation is carried out at transistor level.

Additionally, the user only has to specify the node to which a clock signal is to be applied and is not required to define all the starting and terminating points of path searching operations he or she carries out nor the pattern matching rules to be used for the operations. Thus, the burden that the user has to bear is greatly reduced with the present invention.

Finally, since the user is forced to bear less burden and the dividing operation proceeds fast, the efficiency of design work is greatly improved and the design time is significantly reduced.

It may be clear to those skilled in the art that the present invention is not limited by the above embodiments, which can be modified or changed without departing the spirit and scope of the invention.

What is claimed is:

1. A static timing analyzer for semiconductor integrated circuits comprising:

a memory device for storing a net list as data for circuit connections;

a specifying device for specifying a clock node for receiving an input clock signal; and a control unit connected to said memory device;

said memory device including:

constructing means for constructing a circuit having transistors on the basis of said net list read out of said memory device, said constructed circuit including a sequential circuit;

recognizing means for recognizing said clock node specified by said specifying device from said circuit constructed by said constructing means, said clock node corresponding to at least one of a gate and source/drain region of said transistors;

dividing means for dividing said sequential circuit of said constructed circuit into a plurality of combinational circuits by tracing said recognized clock node on the basis of a clock signal and determining if the output node of said circuit can achieve a high impedance state in response to the clock signal; and searching means for searching for paths in said combinational circuits divided by said dividing means.

2. An apparatus according to claim 1, wherein, if said output node of the circuit receiving the clock signal can go to a high impedance state, the dividing means designates the output node as the starting point for a path searching operation and an input node of the circuit not receiving a clock signal as the terminating point of the path searching operation from the circuit constructed by said constructing means, whereas, if said output node of the circuit receiving the clock signal cannot go to a high impedance state, it designates the output node of the circuit as the clock node and an input node of the circuit not receiving a clock signal as the terminating point of the path searching operation.

3. An apparatus according to claim 1, wherein said dividing means determines if the output node can go to a high impedance state both when said clock signal is at a high level and when it is at a low level.

4. An apparatus according to claim 1, wherein said searching means searches for the critical path that takes the longest time to pass through each of said combinational circuits.

5. A static timing analyzer for semiconductor integrated circuits comprising:

memory means for storing a net list as data for circuit connections;

constructing means for constructing a circuit having transistors on the basis of said net list read out of said memory means;

specifying means for specifying a node for receiving an input clock signal;

recognizing means for recognizing said node specified by said specifying means from said circuit constructed by said constructing means, said node corresponding to at least one of a gate and source/drain region of said transistors;

determining means for determining if the output node of said circuit for receiving a clock signal can go to a high impedance state or not from said circuit constructed by said constructing means on the basis of the node recognized by said recognizing means;

first designating means for designating said output node as the starting point of a path searching operation and an input node of the circuit not receiving a clock signal as the terminating point of the path searching operation if said output node can achieve a high impedance state;

second designating means for designating said output node of said circuit as the node for producing a clock signal and an input node of the circuit not receiving a clock signal as the terminating point of a path searching operation if said output node cannot achieve a high impedance state; and searching means for searching for a path in each of combinational circuits on the basis of the starting and terminating points designated by said first and second designating means.

6. An apparatus according to claim 5, further comprising a dividing means for discriminating between a precharge circuit and a latch circuit by determining if said output node can go to a high impedance state or not when said clock signal is at a low level.

7. A static timing analyzer for semiconductor integrated circuits comprising:

memory means for storing a net list as data for circuit connections;

constructing means for constructing a circuit having transistors on the basis of said net list read out of said memory means;

specifying means for specifying a node for receiving an input clock signal;

recognizing means for recognizing said node specified by said specifying means from said circuit constructed by said constructing means, said node corresponding to at least one of a gate and source/drain region of said transistors;

determining means for determining if the output node of said circuit for receiving a clock signal can achieve a high impedance state or not from said circuit constructed by said constructing means on the basis of the node recognized by said recognizing means, said determining means discriminating between a precharge circuit and a latch circuit by determining if said output node can achieve a high impedance state both when said clock signal is at a high level and when said clock signal is at a low level and determining if said output node can achieve the high impedance state when said clock signal is at the low level;

first designating means for designating said output node as the starting point of a path searching operation and an input node of the circuit not receiving a clock signal as the terminating point of the path searching operation;

second designating means for designating said output node of said circuit as the node for producing a clock signal and an input node of the circuit not receiving a clock signal as the terminating point of a path searching operation if said output node cannot achieve the high impedance state; and searching means for searching for a path in each of combinational circuits on the basis of the starting and terminating points designated by said first and second designating means.

8. A static timing analyzing method for semiconductor integrated circuits, comprising the steps of:

constructing a circuit having transistors from a net list containing data for circuit connections, said constructed circuit including a sequential circuit;

recognizing the node to which the clock signal applied by an input means is supplied from said constructed circuit, the node corresponding to at least one of a gate and source/drain region of said transistors;

dividing said sequential circuit of said constructed circuit into a plurality of combinational circuits on the basis of said recognized node by tracing said recognized clock node on the basis of the clock node and determining if the output node of said circuit can go to a high impedance state in response to the clock signal; and searching for paths through said combinational circuits obtained by division.

9. A method according to claim 8, wherein if said output node of the circuit receiving the clock signal can go to a high impedance state, said output node of the circuit is designated as the starting point for a path searching operation and an input node of the circuit not receiving a clock signal is designated as the terminating point of the path searching operation in said dividing step from the circuit constructed in said constructing step, whereas, if said output node of the circuit receiving the clock signal cannot go to a high impedance state, the output node of the circuit is designated as the clock node and an input node of the circuit not receiving a clock signal is designated as the terminating point of the path searching operation in said dividing step.

10. A method according to claim 8, wherein said circuit is recognized as a clock type CMOS circuit if a signal identical with the clock signal or an inverted clock signal appear on a single node and there are transistors whose paths from the power source to the ground are interrupted by a clock signal and transistors whose gates are commonly connected.

11. A method according to claim 8, wherein it is determined in said dividing step if the output node can go to a high impedance state both when said clock signal is at a high level and when it is at a low level.

12. A method according to claim 8, wherein a precharge circuit is discriminated from a latch circuit in said dividing step by determining in said dividing step if said output node can go to a high impedance state or not when said clock signal is at a low level.

13. A method according to claim 8, wherein said circuit is recognized as a precharge circuit in said dividing step if a signal identical with the clock signal or an inverted clock signal appear on a single node and the node is brought to a high or low level only by a transistor for receiving a clock signal at the gate.

14. A method according to claim 8, wherein said circuit is recognized as a gate circuit in said dividing step if a signal identical with the clock signal or an inverted clock signal appear on a single node and if there is a transistor that can bring said node to a high or low level and the gate of a transistor not receiving a clock signal and that of another transistor are commonly connected.

15. A method according to claim 14, wherein, if said circuit is recognized as a gate circuit, said output node is designated as a clock node and said gate of the transistor not receiving a clock signal is designated as the terminating point of the path searching operation in said dividing step.

16. A static timing analyzing method for semiconductor integrated circuits comprising the steps of:

constructing a circuit having transistors from a net list containing data for circuit connections;

recognizing the node to which the clock signal applied by an input means is supplied from said constructed circuit, the node corresponding to at least one of a gate and source/drain region of said transistors;

determining if the output node of said circuit for receiving a clock signal can achieve a high impedance state or not from said circuit constructed in said constructing step;

designating in the first stage said output node as the starting point of a path searching operation and an input node of the circuit not receiving a clock signal as the terminating point of the path searching operation if said output node can achieve a high impedance state;

designating in the second stage said output node of said circuit as the node for producing a clock signal and an input node of the circuit not receiving a clock signal as the terminating point of a path searching operation if said output node cannot achieve a high impedance state; and searching for a path on the basis of the starting and terminating points designated in said first and second designating steps.

17. A method according to claim 16, wherein said constructed circuit include a sequential circuit.

18. A method according to claim 16, wherein it is determined in said determining step if the output node can go to a high impedance state both when said clock signal is at a high level and when it is at a low level.

19. A method according to claim 17, wherein said sequential circuit is divided into a plurality of combinational circuits in said determining step and said first and second designating steps.

20. A method according to claim 19, wherein the critical path that takes the longest time to pass through each of said combinational circuits is searched for in said searching step.

* * * * *